United States Patent [19]

Santilli et al.

[11] Patent Number: 5,403,973
[45] Date of Patent: Apr. 4, 1995

[54] CUSTOM CONFORMAL HEAT SINKING DEVICE FOR ELECTRONIC CIRCUIT CARDS AND METHODS OF MAKING THE SAME

[76] Inventors: Michael A. Santilli, 4840 Elkridge Rd., Lake Shastina, Calif. 96094; William Z. Morgan, 9714 Forest La. #6005, Dallas, Tex. 75243

[21] Appl. No.: 183,061

[22] Filed: Jan. 18, 1994

[51] Int. Cl.6 .............................................. H05K 7/20
[52] U.S. Cl. .................... 174/15.1; 165/46; 174/252; 361/704; 361/715; 361/720
[58] Field of Search ............ 174/15.1, 252; 361/704, 361/705, 715, 720; 206/328; 165/46

[56] References Cited

U.S. PATENT DOCUMENTS

| | | | |
|---|---|---|---|
| 3,352,415 | 11/1967 | Seeley et al. | 206/78 |
| 4,013,188 | 3/1977 | Ray | 215/347 |
| 4,424,900 | 1/1984 | Petcavich | 206/328 |
| 4,897,509 | 1/1990 | Holleran et al. | 174/258 |
| 4,906,494 | 3/1990 | Babinec et al. | 428/35.2 |
| 5,000,256 | 3/1991 | Tousignant | 165/46 |
| 5,095,626 | 3/1992 | Kitamura et al. | 29/827 |
| 5,315,480 | 5/1994 | Samarov et al. | 361/705 |

FOREIGN PATENT DOCUMENTS

| | | | |
|---|---|---|---|
| 2821182 | 11/1979 | Germany | 206/328 |
| 1-99960 | 4/1989 | Japan | 206/328 |

OTHER PUBLICATIONS

New Products; Liquid Heat Sink; Electronic Packaging and Production; Newton, Mass.; No. 5; May 28, 1988.

Primary Examiner—Morris H. Nimmo
Attorney, Agent, or Firm—Gifford, Krass, Groh, Sprinkle, Patmore, Anderson & Citkowski

[57] ABSTRACT

A protective heat sinking device for an electronic circuit card having upper and lower layers of an air-impermeable polymer material forming an air-impermeable bag. A metallic foil having high thermal conductivity is inserted between the upper layer of air-impermeable polymer material and the top surface of the electronic circuit card. The air-impermeable bag has an open side into which the circuit card is inserted. The bag is evacuated to produce a conformal vacuum seal in which the upper and lower layers of air-impermeable polymer material and the metallic foil are drawn down onto the surface of the circuit card and form a conformal protective cover about its contours. A layer of electrically insulating material may be added between the metallic foil and an upper face of the circuit card to electronically insulate the metallic foil from the circuit components mounted on the upper face of the circuit card contained within the protective heat sinking device. A method for conformally sealing a circuit card in the protective heat sinking device is also provided.

25 Claims, 3 Drawing Sheets

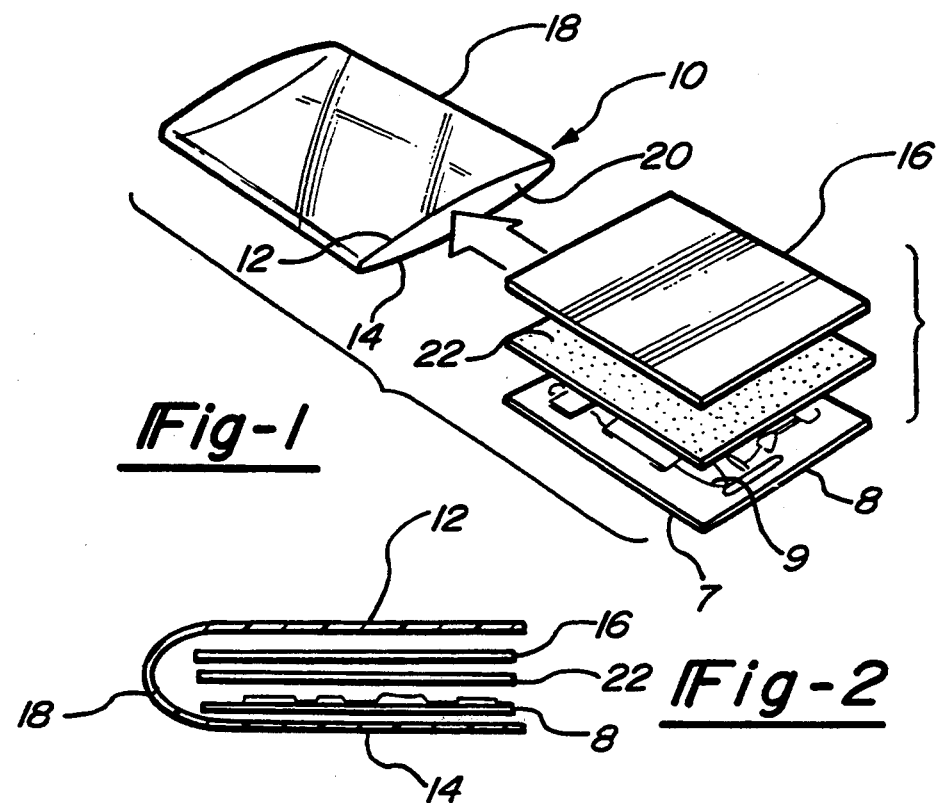
Fig-1
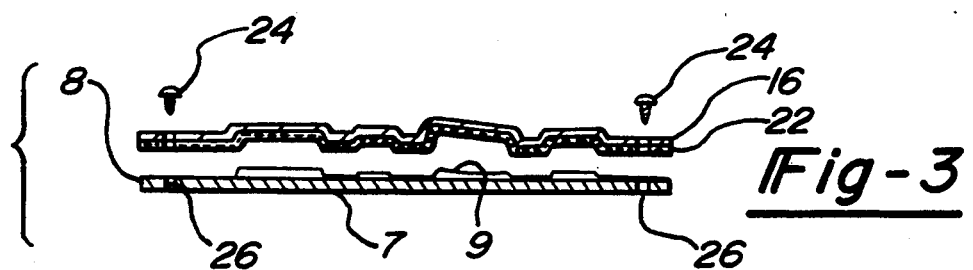
Fig-2
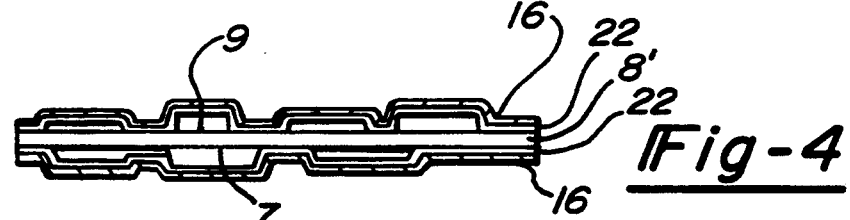
Fig-3
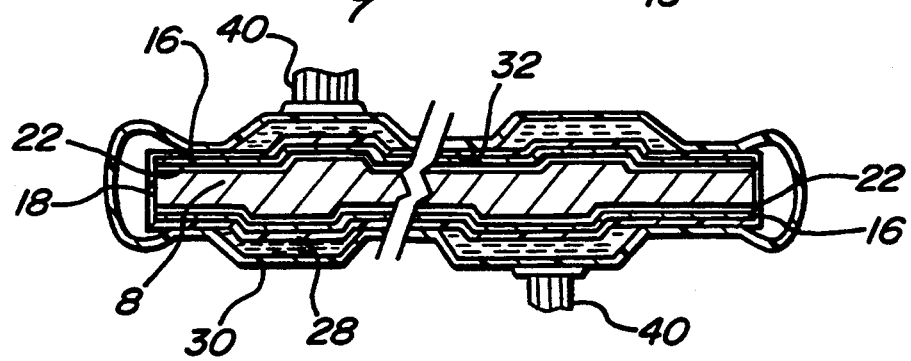
Fig-4
Fig-5

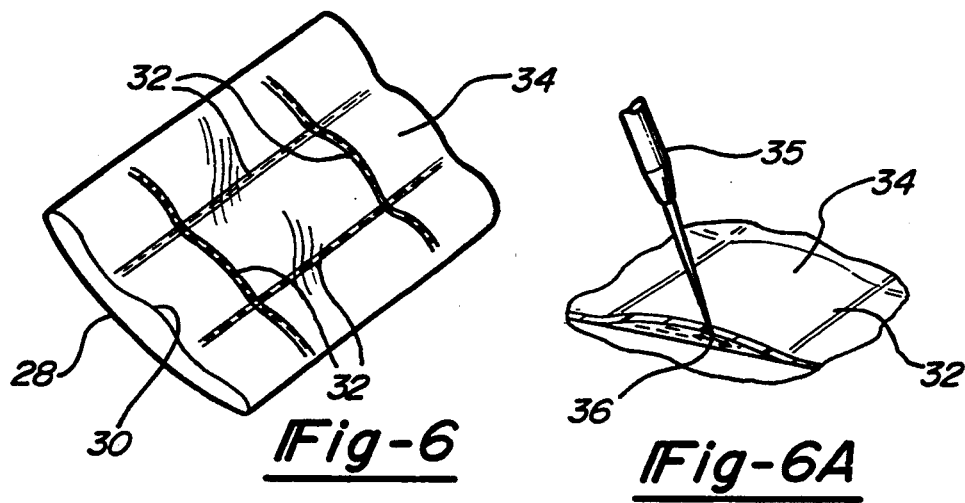
Fig-6
Fig-6A
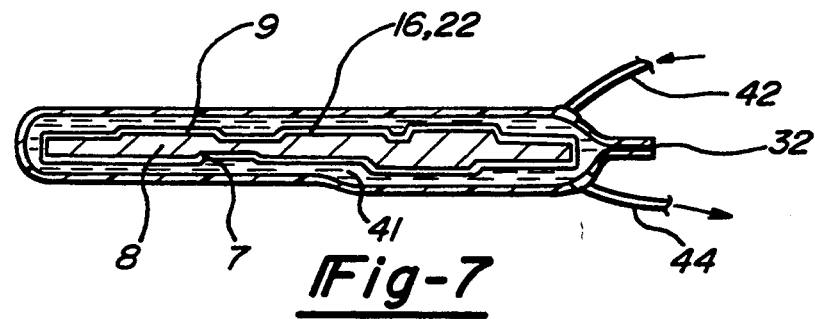
Fig-7
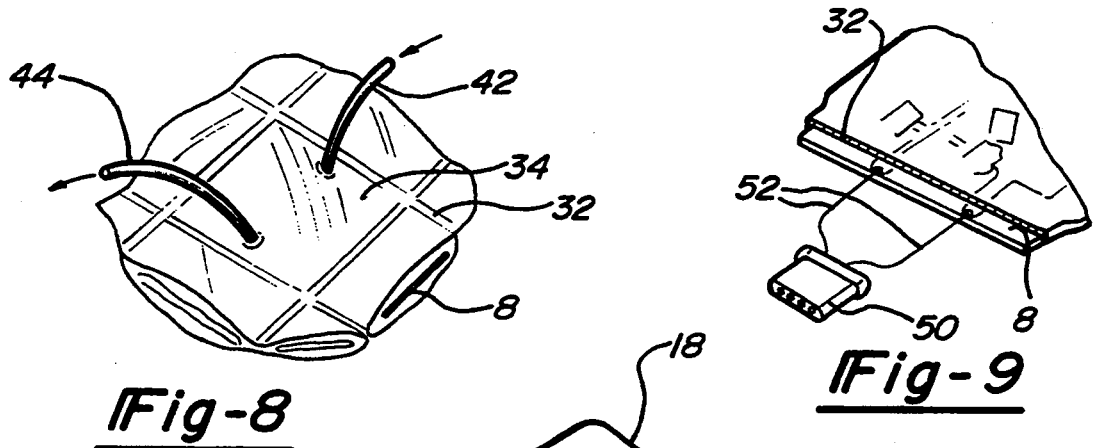
Fig-8
Fig-9
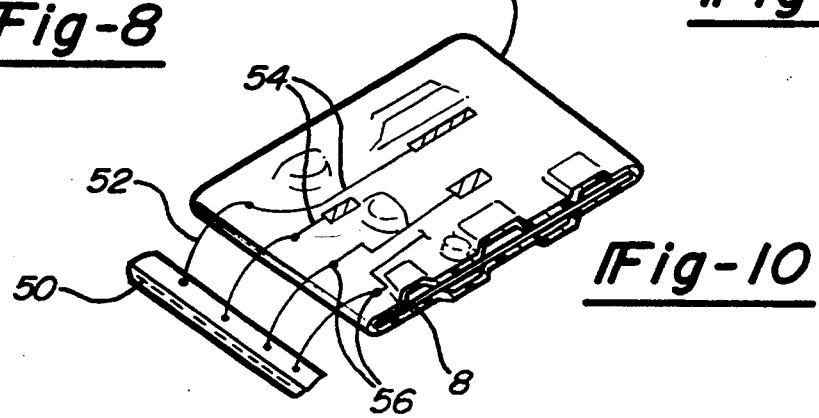
Fig-10

CUSTOM CONFORMAL HEAT SINKING DEVICE FOR ELECTRONIC CIRCUIT CARDS AND METHODS OF MAKING THE SAME

BACKGROUND OF THE INVENTION

I. Field of the Invention

The present invention relates to an electronic packaging device and, more particularly, to a pliable multi-layer bag for enclosing an electronic circuit card.

II. Description of the Prior Art

Conventional covers and, more particularly, heat sinking devices for circuit card assembles are known in the art. These usually consist of aluminum covering sheets which are machined and custom-formed to cover a desired circuit board. The purpose of these heat sinking devices is to provide enhanced thermal conductivity or heat transfer of the heat generated by operation of the components of the circuit board. The heat is transferred from the circuit card through the heat sinking device and is then transferred to the surroundings external to the heat sinking device.

The shortcomings of known heat sinking covers and devices include the prohibitive cost involved in their machining and customizing to ensure they conform to the outline of the circuit card. Furthermore, these assemblies require an electrical grounding in order to additionally provide electro-magnetic protection for the electrical circuits contained within the enclosed circuit card.

SUMMARY OF THE PRESENT INVENTION

The present invention is a protective multi-ply bag for enclosing an electronic circuit card. The multi-ply bag has upper and lower layers of an air-impermeable polymer material. A metallic foil with high thermal conductivity is inserted between the upper layer of the polymer material and the top surface of the circuit card. The upper and lower layers of the air-impermeable material are joined along common edges to form the bag. The bag has an open side which permits insertion of the circuit card therein. The upper and lower layers of the air-impermeable polymer material and the metallic foil are then conformal vacuum-sealed around the circuit card. The bag may be re-expanded and removed after vacuum sealing to expose the metallic foil.

Upon re-expansion and subsequent removal of the bag, the metallic foil conforms to the shape of the components on the face of the circuit card. The metallic foil may then be detached from the circuit card without disturbing the imprint in the foil made by the circuit card. Additional layers of foil may then be added to the original metallic foil layer by a "plating up" process. The additional foil layers enhance the heat sink abilities of the foil once it is reattached to the circuit card. The metallic foil layer may be reattached to the circuit card by screws or other means known in the art.

A layer of an electrically insulating material may additionally be positioned between the metallic foil and the opposed surface of the circuit card prior to the conformal vacuum-sealing of the bag. The insulating layer insulates the metal foil from the components on the circuit card. The insulating layer is designed to adhere to the foil layer after re-expansion and removal of the bag and during any subsequent "plating up" of the metallic foil. The insulating layer and metallic foil may then be reattached to the circuit card as a one-piece unit to provide enhanced heat dissipation.

The multi-ply bag of the present invention may further be applied to a circuit card having components on both sides thereof. This is accomplished simply by adding additional sheets of metallic foil and insulating material to the opposite facing side of the circuit card prior to conformal vacuum-sealing. Additional heat dissipating elements, such as aluminum fins or the like, may be affixed to the exterior of the bag after sealing in order to provide enhanced heat dissipation of the hotter operating circuit components.

In a further embodiment, the vacuum-sealed bag is made up of multiple layers which are permanently sealed about the circuit card. An inner layer is vacuum-sealed about the circuit board. An outer layer is connected to the inner layer along predetermined boundaries, which surround areas in which the inner and outer layers are spatially separated. The spatially separated areas of the bag form partitioned enclosures. The enclosures are designed so as to be positioned over certain components of the face of the circuit card once the bag has been vacuum-sealed. A fluid or wax may be inserted into the enclosures to provide for heat dissipation of certain heat generating components on the circuit card. Alternatively, color-coded dyes may be inserted into the enclosures to provide for quick visual identification of the various components.

In a still further embodiment, the bag may be modified to conformal vacuum-seal about the circuit card and an electrical connector to which the circuit card is mounted. The electrical circuitry normally associated with the connector may further be incorporated between the inner and outer layers of the bag to electrically communicate with the components on the circuit card.

A method for producing a heat sinking device for electronic circuit cards utilizing substantially the above structure is also provided.

BRIEF DESCRIPTION OF THE DRAWINGS

Reference will be made to the attached drawings, wherein like reference numbers refer to like parts throughout the several views, and in which:

FIG. 1 is an exploded view of the protective bag of the present invention;

FIG. 2 is a cross-section of the protective bag of the present invention having a metallic foil and insulating material inserted between the upper layer of the polymer bag and the circuit card;

FIG. 3 is a cross-section, similar to FIG. 2, and showing the imprint of the foil and insulating layers resulting from the vacuum-sealing of the protective bag about the circuit card;

FIG. 4 is a cross-section, similar to FIG. 3, and depicting an alternative embodiment in which the protective bag conforms about components located on both sides of the circuit card;

FIG. 5 is a cross-section, similar to FIG. 4, and showing a further preferred embodiment in which the protective bag has multiple layers which are spatially separated;

FIG. 6 is a perspective of one side of the multi-layer protective bag of FIG. 5 and showing the adhesive partitioning grid;

FIG. 6a is a sectional view of FIG. 6 and showing the means for injecting a fluid into a spatially separated area of the partitioning grid;

FIG. 7 is a cross-section showing a heat dissipating convective fluid flow between inner and outer bag layers;

FIG. 8 is a sectional view of one pocket of the partitioning grid of FIG. 6 and showing a partial convective fluid flow;

FIG. 9 is a cross-section of the protective bag of the invention in a sealing arrangement about the circuit card and which is adjacent to and not encroaching upon an electrical connector to which the circuit card attaches;

FIG. 10 is a perspective of a further embodiment of the protective bag in FIG. 9 and showing electrical interfacing elements built into the protective bag for electrically interfacing the connector with the components on the circuit card;

DESCRIPTION OF THE PREFERRED EMBODIMENT OF THE PRESENT INVENTION

Figure 11:
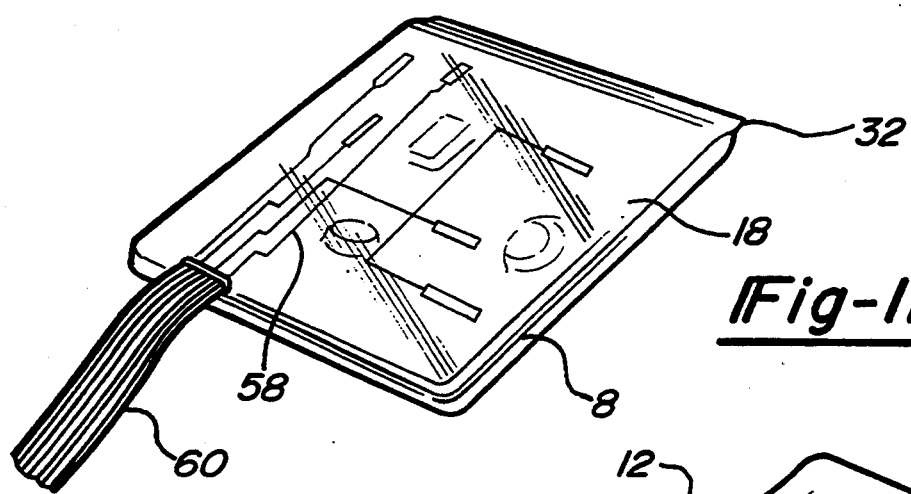
FIG. 11 is a perspective of a further embodiment in which the circuitry of the connector is built into the protective bag and the connector is replaced by a flex ribbon which, in turn, is connected to a further circuit card.

Referring to FIGS. 1 and 2, a custom conformal device 10 for an electronic circuit card 8 is provided. The circuit card 8 has a lower side 7 and an upper side 9. The device 10 includes an upper layer 12 and a lower layer 14 of an air-impermeable material. The upper and lower layers, 12 and 14 respectively, are constructed of a durable polymer, polymer compound, or like material.

A thermally conductive layer 16, such as metallic foil, aluminum foil, aluminum alloy or materials having high thermal conductivity is inserted between the upper air-impermeable polymer layer 12 and the upper side 9 of the electronic circuit card 8. The metallic foil is preferably composed of a metal such as aluminum, or an aluminum alloy, which exhibits very high thermal conductivity. The upper and lower layers, 12 and 14 respectively, are joined along three common edges to form a bag 18. The bag 18 has an open side 20 to permit insertion of the circuit card 8 and the metallic foil 16. The open side 20 many then be sealed by appropriate means known in the art.

A layer of electrically insulating material 22 also constructed of a polymer or polymer compound may be provided adjacent the metallic foil 16 on the side opposite the upper layer 12 of air-impermeable material. The layer of insulating material 22 is positioned within the protective device 10 so as to be in direct contact with an upper side 9 of the circuit card 8. The electrically insulating material 22 is preferably of a polymer construction and may be very similar in composition to that used in the upper and lower layers 12 and 14 of air-impermeable material. The layer of insulating material 22 provides the primary function of electrically insulating the metal foil 16 from the circuit components mounted on the circuit card 8 contained within the protective device 10. This is so in order to prevent electrical shorts or high voltage arcing. The insulated layer 22, out of necessity, also has good thermal conductivity to assist the foil layer 16 in removing heat generated by the circuit components.

An external vacuum source with a vacuum line (not shown) is connected to the bag 18 at a suitable opening. Vacuum pressure causes the bag 18 containing the enclosed metal foil 16 and insulating layers 22 to conformally seal about the contours of the circuit card. Once vacuum sealing has been completed and the vacuum source has been removed, the bag may be re-expanded and removed to reveal the custom-formed metal foil and insulating layers matching the imprint of the face 9 of the circuit card, see FIG. 3.

Referring again to FIG. 3, the insulating layer 22 adheres to the metallic foil 16 upon conformal vacuuming and may be removed along with the foil 16 from the face 9 of the circuit card 8 without upsetting the imprint from the circuit card 8. If desired, additional foil layers may then be added to the original metal foil layer 16 to enhance the heat sink capabilities of the foil. The adding of additional foil layers can be accomplished by a "plating up" process. This involves removing the imprinted foil 16 and insulating layers 22 and repeatedly plate and/or coat up the conductive layer. Such processes are well known in the art. The composition of the insulating layer 22 is such that the plating material from the liquid bath will not adhere to the face of the insulating layer 22 opposite the metal foil 16.

The metal foil 16 and insulating layers 22 may then be reattached to the side 9 of the circuit card 8. This may be accomplished by means known in the art such as the use of screws 24 insertable through holes 26 formed in the layers and through the circuit card 8, respectively. Alternatively, an appropriate non-electrically conductive bonding adhesive (not shown) may be applied between the like-contoured faces of the insulating layer 22 and circuit card 8. In this fashion, the bag device can be used as a disposable accessory for creating a customized heat sink device for a desired circuit card.

Referring to FIG. 4, the protective bag may be conformal vacuum-sealed around a circuit card 8' having circuit components on both sides 7 and 9. Additional metallic foil 16' and insulating layers 22' may be inserted adjacent to the underside 7 of the circuit card in similar fashion to the foil and insulating layers inserted adjacent the upper side 9 of the card 8 as shown in FIGS. 1–3.

Referring to FIGS. 5 and 6, in another preferred embodiment, the bag 18 becomes permanently sealed around the circuit board 8. The bag in this embodiment has inner 28 and outer layers 30 of air-impermeable material on one of or on both sides of the circuit card. The bag's inner layer 28 is vacuum-sealed about the circuit card as previously described. The outer layer 30 is loosely secured to the inner layer 28 along a waffled partitioning grid constructed of adhesive material 32, see FIG. 6.

The adhesive material 32 is in the shape of an intersecting grid pattern. The areas between the inner and outer layers and bounded by the partitioning grid are spatially separated. The spatially separated areas between the bag layers form a plurality of enclosures 34 which are custom designed to overlie various components of the circuit card when vacuum sealed. The layers of metallic foil 16 and insulating material 22 may optionally be inserted inside the multi-layered bag, as previously described, prior to conformal vacuum sealing.

A fluidic material (not shown) may be inserted by a needle 35, see FIG. 6a, through the adhesive layer 32 bounding one of the plurality of enclosures of the protective bag 18. The needle 35 is inserted until the tip 36 passes through the adhesive boundary 32 and into a desired spatially separated enclosure 34. The fluidic materials then injected until it fills the enclosure 34. The hole in the adhesive material left by the needle tip after injection may be simply closed with applied pressure to the adhesive material. The fluidic material may consist of a flourinert fluid or gas or, alternatively, a thermal wax. The inserted gas or wax may be used in combination with, or in the place of, the metal foil layer 16 and insulating layer 22 in order to aid in dissipating heat generated by the circuit card 8.

Referring again to FIG. 5, one or more heat dissipating elements 40 may be affixed to the exterior of layer 30 of the vacuum-sealed bag 18 to provide an outlet for the heat absorbed by the bag layer 30 and to enhance the heat sink capabilities of the bag 18. The elements 40 are preferably aluminum fin structures or the like which are secured to the bag 18 atop the desired circuit component by an adhesive or other known securing means.

Referring to FIG. 7, the adhesive material may also be altered to permit a heat-dissipating fluid 41 to be convected between the inner and outer bag layers and around both sides 7 and 9 of the circuit cards. Any fluid with desirable heat transfer characteristics may be employed. The protective bag 18 of this embodiment includes fluid intake 42 and outlet 44 lines positioned respectively on the upper and lower sides of the circuit card 8. Strips of bonding material 32 are applied to opposing side edges of the circuit board so as to seal the bag to the respective upper/lower sides. The coolant fluid 41 will then flow across the upper face of the card, over the far edge, and return across the lower face of the circuit card before being recollected at the outlet line 44. A separate reservoir, not shown, is provided and connects to the respective inlet and outlet lines to collect and recirculate the fluid.

Referring to FIG. 8, the coolant liquid 41, if desired, may be circulated only through a given spatially separated enclosure 34 which may overlie a particularly hot circuit component. The fluid intake and outlet lines 42 and 44 are respectively attached to the enclosure 34 on opposing sides or corners and in a manner similar to that previously described.

Referring again to FIGS. 5 and 6, the fluidic material employed may be a number of differently-colored dyes separately inserted into the plurality of enclosures 34 which overlie the various components of the circuit card. In this fashion, the components on the circuit card 8 which are assigned certain enclosures 34 may be color-coded for easy identification.

Referring to FIG. 9, the circuit card assembly typically has an electrical connector 50 for connecting the circuit card 8 to another device, typically another circuit card (not shown). Each circuit card 8 is provided with a connector 50. Typically, a plurality of connectors 50 and circuit cards 8 are provided as multiple sheets in a stacked, parallel arrangement.

The protective bag 18 is preferably sealed in such a manner so as to leave the circuit card connector 50 exposed. This may be accomplished by placing an adhesive bonding strip 32 along the bag's open edge which contacts the surface of the circuit card. The length of the bonding strip should extend the entire open side of the bag so as to allow a 360 degree seal around the base of the circuit card 8. The bag 18 is secured to the circuit card 8 at a point where it will not interfere with the electrical connections 52 between the connector 50 and the circuit card 8. Conformal vacuum sealing then draws the bag down onto the outline of the circuit card 8.

In a still further embodiment, see FIG. 10, an electrical connection scheme 54 may be incorporated directly into the bag which is conformally sealed about the circuit card. The bag 18 is sealed to the circuit card prior to the attachment of the connector 50. The connector is then attached to the outside of the bag by soldering, clamping, epoxying, or similar electrical attachment. The electrical interface between the circuit card 8 and the connector 50, and through the bag, is accomplished by a number of electrically conductive solder pads 56. The solder pads 56 are provided on the external surface on the bag upper layer and conduct input signals from the connector 50 through the circuitry 54 built into the bag and to the circuit card 8. The solder pads 56 also provide for output signals from the circuit card 8 to the connector 50.

In a still further embodiment, see FIG. 11, the entire connector circuitry becomes an integral part of the bag. Specifically, testing and diagnostic circuitry 58 of the connector 50 is incorporated into the bag structure and renders unnecessary the connection scheme of FIG. 10. A communication ribbon 60 replaces the connector 50 and extends from the edge of the conformally sealed bag 18 and attaches to preferably the next circuit board arrangement (not shown). The bag can also contain circuitry that connects to board components and not just to the connector.

Figure 12:
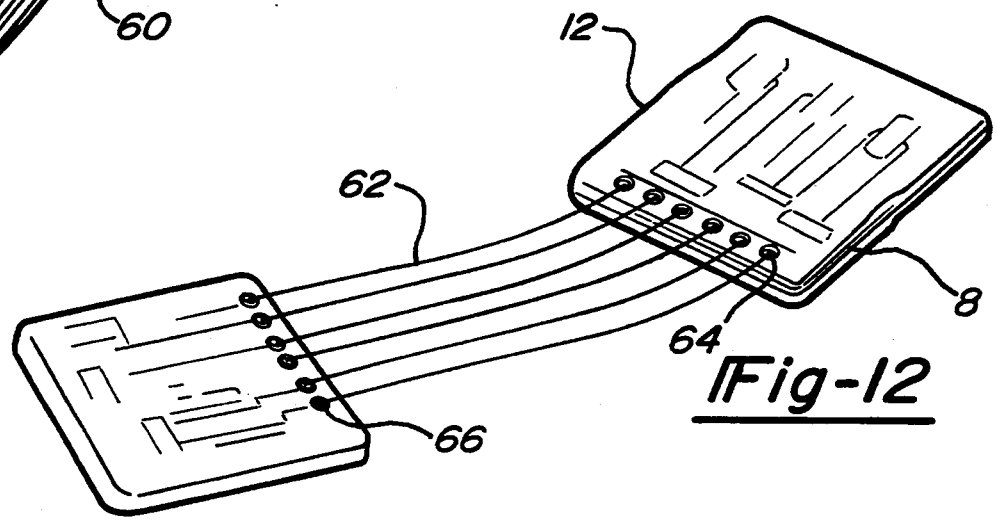
FIG. 12 is a perspective of a further embodiment in which the circuitry incorporated into the bag acts as a flex circuit to connect the circuit card contained within the bag to a further circuit card.

Referring to FIG. 12, the bag 12 which surrounds the circuit board may be provided with flex circuitry 62. The flex circuitry 62 electrically connects, at 64, to the diagnostic circuitry in order to electrically connect the enclosed circuit card with a further circuit card. The flex circuitry 62 connects to the further card at connections 66.

Figure 13:
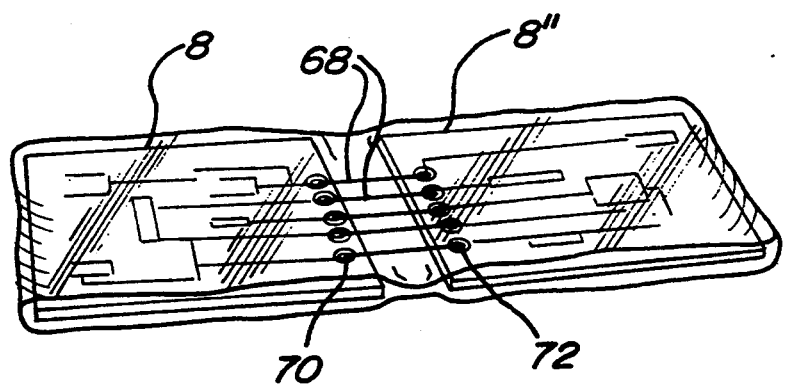
FIG. 13 is a perspective of a further embodiment in which a protective bag encompasses a pair of circuit cards and provides the flex circuitry for the electrical connections from one card to another.

Finally, referring to FIG. 13, the bag 12 enclosed both a first circuit card 8 and a second circuit card 8". Electrical contacts 68 extend from connectors 70 on card 8 to connections 72 on card 8' and are incorporated into the bag 12. The bag may incorporate as many circuit cards as is desired using the contacts.

A method for producing a custom conformal heat sinking device is also provided. The method employs the structure substantially as set forth above and includes the steps of inserting the circuit card into the bag of plastic material, inserting the metallic foil and the insulating layer between the upper layer of the bag and the circuit evacuating the bag to conformally seal the upper and lower surfaces of the bag and the foil to the top and bottom faces of the circuit card. Other steps include re-expanding and removal of the bag after evacuating or retaining the bag in the vacuum-sealed condition. Also included are the steps of inserting waxes or dies within the inner and outer layers of the bag, as well as circulating a fluid within the sealed bag.

Having described my invention, additional embodiments will become apparent to those skilled in the art to which it pertains.

I claim:

1. A protective device for an electronic circuit card, comprising:
   a bag having an upper layer and a lower layer of an air-impermeable material, said upper and lower layers being joined along three common edges, said bag having an open side to permit insertion of a circuit card;

at least one layer of a metallic foil having high thermal conductivity, said at least one layer of metallic foil being insertable in said bag adjacent to at least one of said upper and lower layers of air-impermeable material; and when said electronic circuit card is inserted in said bag and said bag is evacuated, said bag conformally seals to said electronic circuit card and conformally shapes said metallic foil to the contours on a side of said electronic circuit card adjacent said upper layer.

2. The protective device as described in claim 1, further comprising at least one layer of electrically insulating material disposed adjacent to said at least one layer of metallic foil on a side opposite said at least upper layer and lower layer of air-impermeable material, said layer of insulating material being in direct contact with said circuit card when said circuit card is inserted into said device, said layer of insulating material also exhibiting good thermal conductivity characteristics.

3. The protective device as described in claim 1, further comprising said upper and lower layers of air-impermeable material and said at least one layer of metallic foil being vacuum sealable to said circuit card to conform to the shape of said circuit card, said bag being capable of being reexpanded and removed after said vacuum sealing to expose layer of metallic foil.

4. The protective device as described in claim 3, further comprising additional layers of metallic foil being added to said at least one layer of metallic foil exposed by the removal of said bag.

5. The protective device as described in claim 1, further comprising said air-impermeable material being a polymer compound.

6. The protective device as described in claim 1, further comprising said metallic foil being constructed of an aluminum material.

7. The protective device as described in claim 2, further comprising said electrically insulating material being constructed of a polymer compound.

8. The protective device as described in claim 1, further comprising the release of said vacuum-sealing causing said upper and lower layers of said air-impermeable material to revert back to their original shape.

9. The protective device as described in claim 1, wherein said upper and lower layers each further comprise inner and outer layers, said inner and outer layers are connected along predetermined boundaries to form at least one spatially separated enclosure between said layers.

10. The protective device as described in claim 9, further comprising a fluid capable of being injected into said at least one spatially separated enclosure.

11. The protective device as described in claim 10, wherein said fluid is a thermal wax.

12. The protective device as described in claim 10, wherein said fluid is a fluorinert.

13. The protective device as described in claim 10, wherein said fluid is a color-coded dye.

14. The protective device as described in claim 9, further comprising a fluid capable of being circulated throughout said at least one enclosure.

15. The protective device as described in claim 1, further comprising electrical circuitry built into said bag, said circuitry communicating an electrical connector with circuit components located on said circuit card.

16. The protective device as described in claim 1, further comprising affixing at least one heat dissipating element to an external side of said at least one upper and lower layer.

17. The protective device as described in claim 15, further comprising flex circuitry for electrically connecting said circuit card in said bag to a further circuit card.

18. The protective device as described in claim 17, wherein said bag provides electrical circuitry for interfacing two or more circuit cards to be contained within said bag.

19. A method for conformal vacuum-sealing of a protective device onto an electronic circuit card, comprising the steps of:

inserting a circuit card into a bag of a plastic material, said bag having a top surface adjacent an upper surface of said electronic circuit card, and a bottom surface adjacent a lower surface of said electronic circuit card;

inserting a metallic foil between at least one of said top surface and said lower surface of said bag and said opposing surface of said electronic circuit card; and evacuating said bag to conformally seal said metallic foil to said electronic circuit card, said metallic foil constituting a heat sink for the electrical components mounted on said electronic circuit card.

20. The method as described in claim 19, further comprising the step of reexpanding and removing said bag to expose said metallic foil.

21. The method as described in claim 20, further comprising the step of adding additional layers of said metallic foil to said exposed metallic foil.

22. The method as described in claim 19, further comprising the step of inserting at least one layer of electrically insulating material between said metallic foil and said opposing surface of said electronic circuit card prior to said step of evacuating said bag so as to provide an insulating layer between said metallic foil and said circuit card.

23. The method as described in claim 19, further comprising the step of providing said upper and lower bag layers each as inner and outer layers which are separately connected along predetermined boundaries, said respective inner and outer layers forming enclosures between said inner and outer layers.

24. The method as described in claim 23, further comprising the step of inserting a fluid into said enclosures.

25. The method as described in claim 23, further comprising the steps of circulating a fluid through at least one of said enclosures.

* * * * *